(12) United States Patent
Schmitz et al.

(10) Patent No.: US 8,809,095 B2
(45) Date of Patent: Aug. 19, 2014

(54) MICROMECHANICAL COMPONENT AND METHOD FOR PRODUCING A MICROMECHANICAL COMPONENT HAVING A THIN-LAYER CAP

(75) Inventors: Volker Schmitz, Pfullingen (DE); Axel Grosse, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 758 days.

(21) Appl. No.: 12/451,327

(22) PCT Filed: May 19, 2008

(86) PCT No.: PCT/EP2008/056117
§ 371 (c)(1),
(2), (4) Date: Mar. 29, 2010

(87) PCT Pub. No.: WO2008/145553
PCT Pub. Date: Dec. 4, 2008

(65) Prior Publication Data
US 2011/0006444 A1    Jan. 13, 2011

(30) Foreign Application Priority Data
Jun. 1, 2007    (DE) .......................... 10 2007 025 880

(51) Int. Cl.
*H01L 27/14*    (2006.01)
(52) U.S. Cl.
USPC ............... 438/50; 438/53; 257/414; 257/416; 257/419; 257/E21.002

(58) Field of Classification Search
CPC .............................................. B81C 2203/0136
USPC ....... 438/50, 53; 257/414, 416, 419, E21.002
See application file for complete search history.

(56) References Cited

U.S. PATENT DOCUMENTS

| 5,919,364 A | 7/1999 | Lebouitz et al. | |
| 2003/0173330 A1* | 9/2003 | Lutz ................................ | 216/11 |
| 2004/0212028 A1 | 10/2004 | Dougherty | |
| 2007/0190680 A1* | 8/2007 | Fukuda et al. .................. | 438/50 |

FOREIGN PATENT DOCUMENTS

| DE | 10006035 | 8/2001 |
| DE | 100 17 422 | 10/2001 |
| DE | 10056716 | 5/2002 |
| EP | 1 274 648 | 1/2003 |
| JP | 10-153617 | 6/1998 |
| JP | 2003-530234 | 10/2003 |
| JP | 2005-61374 | 3/2005 |
| JP | 2006-526509 | 11/2006 |
| JP | 2007-210083 | 8/2007 |
| JP | 2007-216309 | 8/2007 |
| JP | 2009-521335 | 6/2009 |

* cited by examiner

*Primary Examiner* — Jose R. Diaz
(74) *Attorney, Agent, or Firm* — Kenyon & Kenyon LLP

(57) ABSTRACT

A micromechanical component having a substrate, a micromechanical functional layer situated above the substrate, and an encapsulation layer situated above the functional layer, and a method for producing the micromechanical component are provided, the encapsulation layer having at least one trench, and a bridging of the trench by at least one electrically insulating connection link is provided.

14 Claims, 5 Drawing Sheets

MICROMECHANICAL COMPONENT AND METHOD FOR PRODUCING A MICROMECHANICAL COMPONENT HAVING A THIN-LAYER CAP

BACKGROUND OF THE INVENTION

1. Field of the Invention

The present invention relates to a method for producing a micromechanical component.

2. Description of Related Art

Such micromechanical components are generally known. For example, a micromechanical component and a method for producing a micromechanical component are known from printed publication EP1274648B1, which has a functional level having movable and fixed structures, the fixed structures being separated from each other by trenches and oxide stoppers, which fill in the trenches. The method provides first of all the formation of a functional layer, a subsequent etching of sacrificial layers through the trenches, and a final sealing of the trenches using oxide stoppers. A circuit trace level for the contacting of movable and fixed structures of the functional layer is formed underneath the functional layer, which requires a multitude of complicated and expensive process steps.

SUMMARY OF THE INVENTION

The micromechanical component according to the present invention and method according to the present invention for producing a micromechanical component according to the present invention as recited in the independent claims have the advantage that relative to the related art, they achieve a significantly lower number of process steps for producing the micromechanical component, in particular in the production of sensors and actuators. The required process steps are reduced by encapsulating the micromechanical component using an encapsulation layer, in particular using a thin-layer cap, the encapsulation layer having at least the one trench, so that electrically insulated encapsulation layer elements form. The encapsulation layer elements are optionally contacted in the functional layer and in a top metallic layer. Thus, the encapsulation layer elements themselves are available as circuit traces and allow for a circuit trace level in the top metallic layer. Complicated and expensive process steps for producing circuit traces and circuit trace levels underneath the functional layer may be omitted. Preferably, the encapsulation layer elements are completely surrounded by at least one trench. For the mechanical connection of the encapsulation layer elements, at least the one electrically insulating connection link is provided, the connection link and the encapsulation layer preferably being connected as a single piece at the time that the encapsulation layer is mounted. In particular, a stable mechanical fixing of the encapsulation layer element allows for a connection between the encapsulation layer element and a functional-layer structure, which is not fixed in the functional layer, since in this case the encapsulation layer element acts as a mounting support for the structure and at the same time as a circuit trace for the electric contacting of the structure.

According to one preferred refinement, a surface normal of a trench wall of the trench has at least two different angles with regard to a direction that is perpendicular to the principal plane of extension of the substrate. Such a profile allows for a connection link whose dimensions along a direction that is perpendicular to the principal plane of extension are variable and are accordingly adjusted to the required specification for insulating capability and the mechanical load-bearing capacity. In particular, a connection link having smaller dimensions than the encapsulation layer thickness is provided.

An additional subject matter of the present invention is a method for producing a micromechanical component, the substrate being provided with the first insulation layer and the functional layer in a first method step, preferably an SOI wafer is provided, the functional layer being structured in a second method step, preferably by a known trenching process, particularly preferably by a Bosch or DRIE process; and the second insulation layer is deposited in a third method step, the second insulation layer being patterned in a fourth method step; and the encapsulation layer, in particular a silicon thin-layer cap, is deposited in a fifth method step, the encapsulation layer being provided with at least the one trench in a sixth method step, at least the one connection link of the encapsulation layer being retained during the formation of the trench to bridge the trench. This forms encapsulation layer elements that act as circuit traces and at the same time are mechanically fixed. Furthermore, the trench forms an access to the functional layer of the micromechanical component, so that etching processes and/or oxidation processes in the encapsulation layer and/or the functional layer are made possible in subsequent method steps. In particular, a doping and/or an annealing of the encapsulation layer is provided. The insulation layers preferably are used for the electric and spatial separation of the adjacent layers, and particularly preferably as protection and sacrificial layers.

According to one preferred refinement, after the sixth method step, the first and/or the second insulation layer is etched through the trench by an etching means in a seventh method step. In particular, the etching forms movable structures in the functional level. The mechanical fixing of the encapsulation layer elements by the connection links allows for in particular an undercutting of elements in the functional layer, which are not fixed in the functional layer itself, but rather only have a connection to an encapsulation layer element and are contacted by it. Such structures act as electrodes, in particular.

According to another preferred refinement, after the seventh method step, an oxidation method, preferably a thermal oxidation, is performed in an eighth method step, in particular a third insulation layer being formed to seal the encapsulation layer and/or an oxidation of the connection link taking place to reduce the electric conductivity. Preferably the sealing of the encapsulation layer is subdivided into two consecutive method sub-steps, the thermal oxidation of at least the one connection bridge taking place in a first method sub-step, in particular the trench being partially sealed, and an oxidation for the complete sealing of the trench and/or of trench subregions being performed in a second method sub-step. It is advantageous that the pressure region of the micromechanical component may be adjusted in the oxidation process.

According to another preferred refinement, in a ninth method step following the eighth method step, the third insulation layer is patterned, and in a subsequent tenth method step a circuit trace, preferably of metal, is positioned on the third insulation layer, in particular the encapsulation layer element being contacted by the circuit trace. When the encapsulation layer element is contacted, it acts as a circuit trace and allows for a circuit trace level on the encapsulation layer. Due to the possible contacting of insulated encapsulation layer elements, in particular intersections of two electrically separated metallic circuit traces on a metallic layer are possible.

According to another preferred refinement, after the tenth method step, a protective level is deposited and patterned in an eleventh method step, the protective level being formed of polyimide, in particular. The protective level minimizes the stress sensitivity of the micromechanical component, in particular in a subsequent packaging process.

According to another preferred refinement, a surface normal of one trench wall of the trench is provided with at least two different angles with regard to a direction that is perpendicular to a principal plane of extension of the substrate in a sixth method step. Preferably, the trench is formed by a trenching process, which is initially performed with a high loss of edges and later with a low loss of edges, so that the connection links are undercut. Such a profile allows for a connection link whose dimensions along a direction perpendicular to the principal plane of extension is variable and is accordingly adjusted to the required specification for the insulation capacity and the mechanical load-bearing capacity.

BRIEF DESCRIPTION OF THE DRAWINGS

Exemplary embodiments of the present invention are shown in the drawing and are explained in greater detail in the following description.

The figures show.

DETAILED DESCRIPTION OF THE INVENTION

Figure 1A:
FIGS. 1a to 1k show a schematic illustration of the production steps for producing a micromechanical component according to a first specific embodiment of the present invention.
Figure 1B:
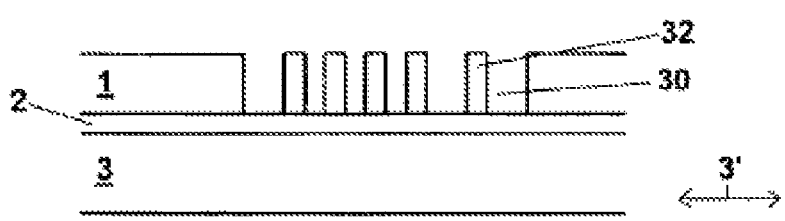
Figure 1C:
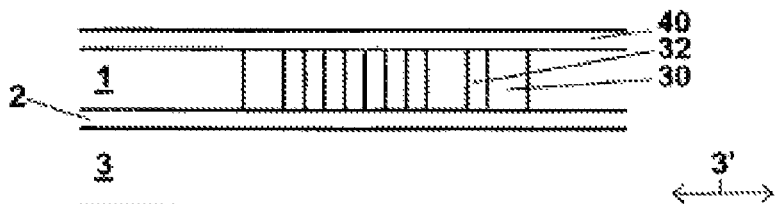
Figure 1D:
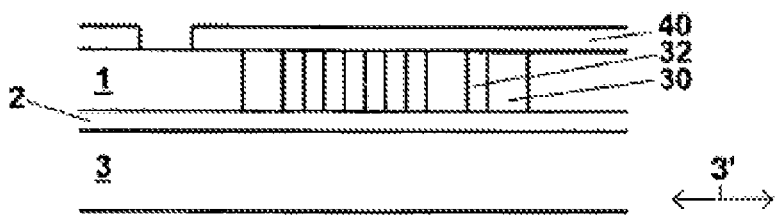
Figure 1E:
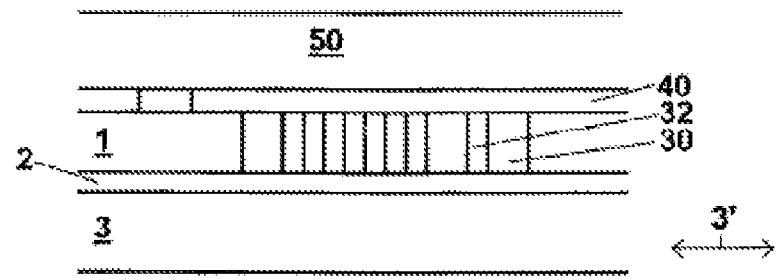
Figure 1F:
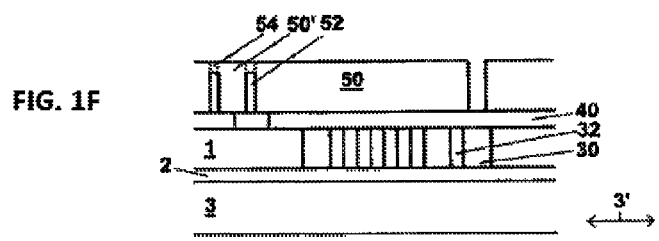
Figure 1G:
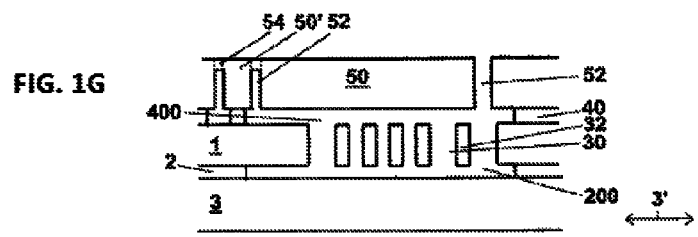
Figure 1H:
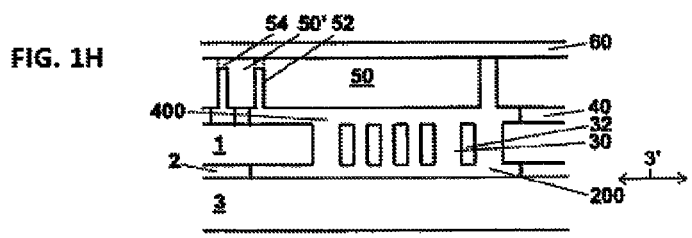
Figure 1I:
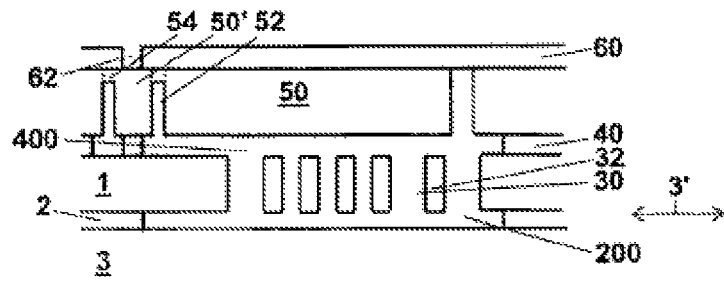
Figure 1J:
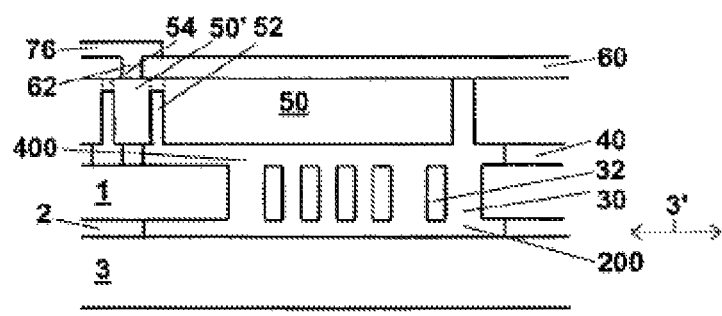
Figure 1K:
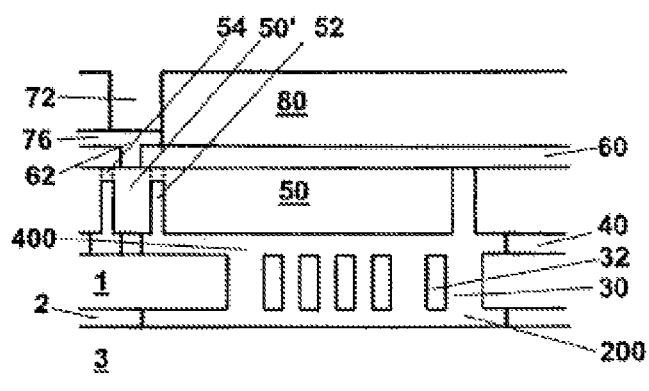

To illustrate the method according to the present invention for producing a micromechanical component according to a first specific embodiment, FIGS. 1a through 1k show the production steps of the micromechanical component schematically with reference to a plurality of precursor structures of the micromechanical component. FIG. 1a shows a first precursor structure, which represents a substrate 3, and substrate 3, in particular a silicon substrate, is provided with a first insulation layer 2 and a functional layer 1 situated above first insulation layer 2, preferably an epi-Si-poly-layer or Si-poly-layer, and in particular a process for planarizing functional layer 1 is provided. FIG. 1b shows a second precursor structure to illustrate the second method step, functional layer 1 being patterned, in particular to produce movable parts 32 and hollow spaces 30 in functional layer 1. FIG. 1c illustrates a third method step on the basis of a third precursor structure, a second insulation layer 40, in particular, an oxide layer, being deposited and preferably a planarization of insulation layer 40 being performed. FIG. 1d shows a fourth precursor structure to illustrate a fourth method step, second insulation layer 40 being patterned, preferably to form a resistance to a subsequent etching process in parts of the second insulation layer 40. To illustrate a fifth method step, FIG. 1e shows a precursor structure, an encapsulation layer 50, in particular a silicon thin-layer cap, being deposited, an epitaxial method preferably being used. FIG. 1f shows a subsequent sixth method step on the basis of a sixth precursor structure, the encapsulation layer being patterned, preferably using a trenching process, so that at least one trench 52 forms, at least one connection link 54 of encapsulation layer 50 remaining to bridge trench 52 in the patterning process. In particular, a trenching process of trench 52 forms connection link 54, at the beginning a slight loss of edges and ultimately a higher loss of edges being provided, so that the connection link is undercut and thus is formed only across a part of the encapsulation layer thickness. In particular, it is provided that an encapsulation layer element 50' is completely enclosed by at least one trench 52. FIG. 1g shows a seventh method step on the basis of a seventh precursor structure, a sacrificial layer etching of the first and/or second insulation layer 2, 40 being performed, preferably an etching means being supplied to insulation layers 2, 40 through trench 52, and particularly preferably, movable structures 32 being formed in functional level 1. On the basis of an eighth precursor structure, FIG. 1h illustrates an eighth method step, an oxidation method, preferably a thermal oxidation method, being performed, which reduces the electric conductivity of connection link 54 and in particular forms a seal of encapsulation layer 50 using a third insulation layer 60. In this connection, a higher oxidation rate is achieved on the surface of encapsulation layer 50 than inside encapsulation layer 50 and/or inside functional layer 1, since the gas flow in the oxidation process is lower there. On the basis of a ninth precursor structure, FIG. 1i shows a ninth method step, third insulation layer 60 being patterned. A tenth precursor structure illustrated in FIG. 1j represents a tenth method step for positioning a circuit trace 76, in particular a circuit trace 76 of metal, on third insulation layer 60, in particular encapsulation layer element 50' being contacted by circuit trace 76 and forming an electrically conductive connection together with circuit trace 76. On the basis of an exemplary structure of a component according to the present invention, in accordance with a first specific embodiment, FIG. 1k shows an eleventh method step, a protective level 80 being positioned on the surface of the micromechanical component, preferably of polyimide, in order to decrease the stress sensitivity of the micromechanical component.

Figure 2:
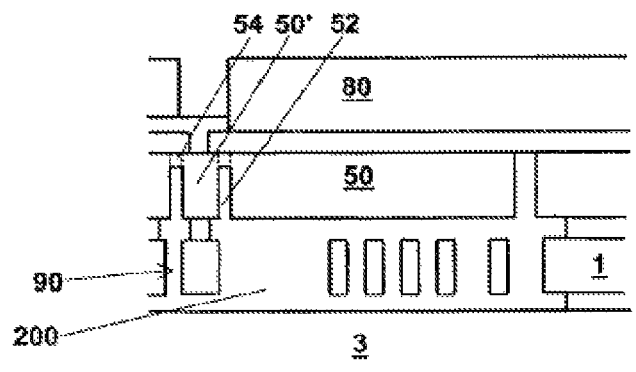
FIG. 2 shows a schematic illustration of a micromechanical component according to a second specific embodiment of the present invention.

FIG. 2 shows the structure of a micromechanical component according to a second specific embodiment of the present invention, which is based, however, essentially on the structure of the micromechanical component according to the first specific embodiment (FIG. 1k). Therefore, the following discusses only the particulars of the second specific embodiment in greater detail in comparison with the first specific embodiment of the present invention. In accordance with a second specific embodiment, the micromechanical component according to the present invention has an encapsulation layer element 50' in an encapsulation layer 50 in accordance with a first specific embodiment of the micromechanical component according to the present invention shown in FIG. 1k, which is connected in a mechanically stable manner to a structure 90 in the functional layer, and in this instance, in contrast to a first specific embodiment (FIG. 1k) of the micromechanical element according to the present invention, structure 90 is not mechanically fixed in the functional layer. The encapsulation layer element has an electrically conductive contact to a circuit trace 76, encapsulation layer element 50' being mechanically fixed via connection links 54. Such a structure is made possible by a trench 52 having connection links 54 according to the present invention, connection links 54 allowing for a mechanical fixing of encapsulation layer element 50' on the one hand, and allowing for a trench opening as an etching access on the other hand. Furthermore, an electric insulation of encapsulation layer element 50' from encapsulation layer 50 is achieved through an at least partial oxidation of connection links 54.

Figure 3A:
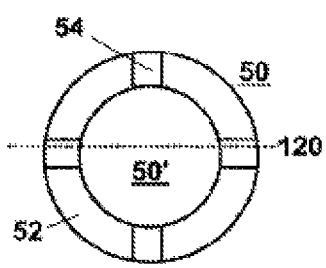
FIGS. 3a and 3c show, respectively, a schematic plan view of a sub-element of the micromechanical component according to the present invention, in accordance with the first or the second specific embodiment.
Figure 3B:
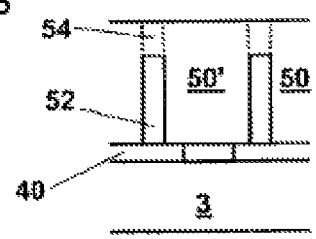
FIGS. 3b and 3d show, respectively, a schematic side view of the same sub-element in a sectional plane, which is schematically indicated in the respective view.
Figure 3C:
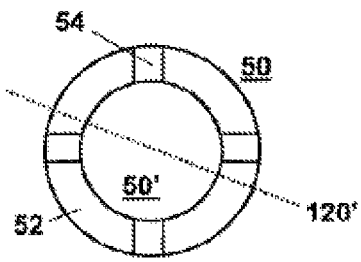
Figure 3D:
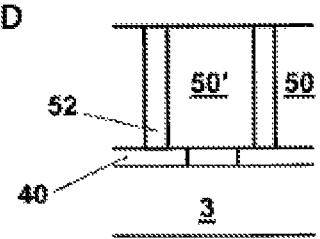

FIGS. 3a and 3c respectively show by way of example one schematic plan view of a sub-element of the micromechanical component according to the present invention, in accordance with the first specific embodiment (FIG. 1k) or the second specific embodiment (FIG. 2), while FIGS. 3b and 3d respectively show one exemplary schematic side view of the same sub-element in a sectional plane, which is schematically indicated by 120, 120' in the respective view. In FIG. 3a, a plan view of an encapsulation layer 50 is shown, encapsulation layer 50 having an encapsulation layer element 50', which is set apart from encapsulation layer 50 by a trench 52 and mechanically fixed by connection links 54. A cross-sectional line 120 illustrates a cross section of the structure, which is shown in FIG. 3b and also illustrates encapsulation layer 50 having encapsulation layer element 50' set apart from encapsulation layer 50 by trench 52. Since in the plan view illustration of FIG. 3a cross-sectional line 120 crosses connection links 54, connection links 54 are also illustrated in the cross-sectional illustration of FIG. 3c. In the same way, FIG. 3b shows a plan view of the same sub-region of the micromechanical component, the illustration having a cross-sectional line 120' such that cross-sectional line 120' does not cross connection links 54. In FIG. 3d, which shows the cross-sectional illustration of the same structure as FIG. 3b along the cross-sectional line 120', connection links 54 are consequently not illustrated, but rather trench 52 extends across the entire encapsulation layer thickness.

Figure 4A:
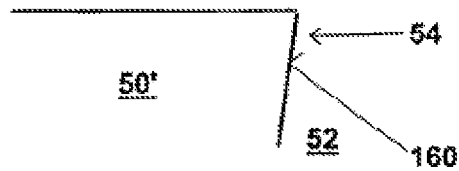
FIGS. 4a through 4c show different variants of a subregion of the micromechanical component according to the present invention, in accordance with the first or the second specific embodiment.
Figure 4B:
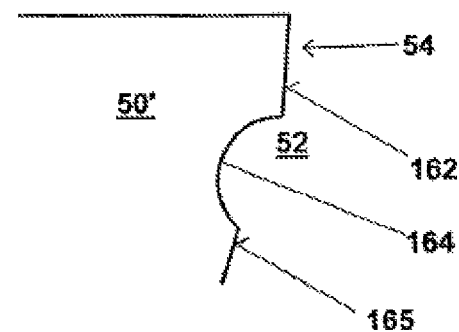
Figure 4C:
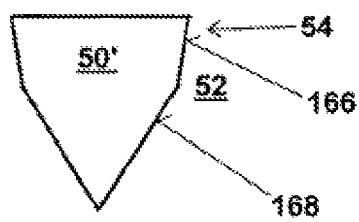

FIGS. 4a through 4c show different variants of a sub-region of the micromechanical component according to the present invention, in accordance with the first or the second specific embodiment (FIG. 1k, 2). FIGS. 4a to 4c show trench walls 160 through 168 of an exemplary trench 52 in encapsulation layer 50 of the micromechanical component according to the present invention, in accordance with the first or the second specific embodiment, the trench walls being undercut and surface normals of the trench walls having, depending on the trenching process, in the schematic illustration in FIG. 4a exactly one angle, in the schematic illustration in FIG. 4b a plurality of angles, or in the schematic illustration in FIG. 4c two angles, with respect to a direction perpendicular to principle plane of extension 3'. In this manner, connection links 54 may be provided with different profiles, depending on the requirement for the electric insulation capacity and/or for the mechanical connection stability.

Figure 5:
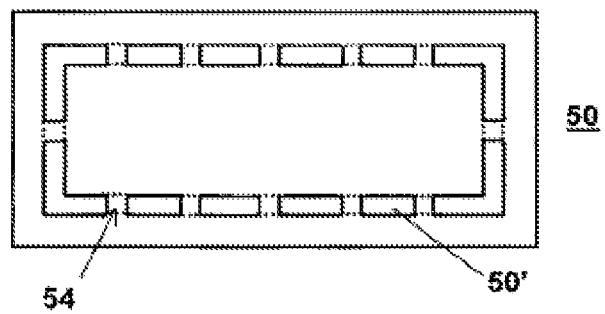
FIG. 5 shows a plan view of a micromechanical component according to a further specific embodiment of the present invention.

In FIG. 5, a plan view of the micromechanical component according to the present invention in accordance with another specific embodiment is shown schematically, an encapsulation layer 50 and electrically insulated encapsulation layer elements 50', which are mechanically fixed by connection links 54, being shown. Encapsulation layer elements 50 form circuit traces for contacting and/or for mechanically fixing structures disposed in functional level 1, which preferably act as electrodes.

What is claimed is:

1. A method for producing a micromechanical component, the micromechanical component including: (a) a substrate, (b) a functional layer situated above the substrate, and (c) an encapsulation layer situated above the functional layer, the encapsulation layer including at least one trench and encapsulation layer elements formed by the at least one trench, the method comprising:
   providing the substrate with a first insulation layer and the functional layer;
   patterning the functional layer;
   depositing a second insulation layer;
   patterning the second insulation layer;
   depositing the encapsulation layer; and
   providing the encapsulation layer with the at least one trench, wherein:
      at least one encapsulation layer element of the encapsulation layer elements is separated from the remainder of the encapsulation layer by the at least the one trench;
      at least one electrically insulated connection link of the encapsulation layer is retained to bridge the trench for mechanical connection of the encapsulation layer elements;
      a thickness of the at least one electrically insulated connection link is smaller than a thickness of the encapsulation layer.

2. The method as recited in claim 1, wherein the encapsulation layer adjacent to the trench have a fixed mechanical connection via the at least one electrically insulated connection link.

3. The method as recited in claim 1, wherein the encapsulation layer is completely surrounded by at least the one trench.

4. The method as recited in claim 1, wherein the encapsulation layer is completely surrounded by at least the one trench.

5. The method as recited in claim 1, wherein a surface normal of a trench wall of the trench has at least two different angles with regard to a direction that is perpendicular to a principal plane of extension of the substrate.

6. The method as recited in claim 1, wherein a surface normal of a trench wall of the trench has at least two different angles with regard to a direction that is perpendicular to a principal plane of extension of the substrate.

7. The method as recited in claim 1, wherein a surface normal of a trench wall of the trench has at least two different angles with regard to a direction that is perpendicular to a principal plane of extension of the substrate.

8. The method as recited in claim 1, further comprising etching at least one of the first and the second insulation layer through the trench.

9. The method as recited in claim 1, further comprising performing an oxidation so as to form a third insulation layer.

10. The method as recited in claim 9, further comprising patterning the third insulation layer.

11. The method as recited in claim 10, further comprising positioning a circuit trace on the third insulation layer so that the encapsulation layer is contacted by the circuit trace.

12. The method as recited in claim 11, further comprising depositing a protective level, the protective level being formed of polyimide.

13. The method as recited in claim 1, further comprising performing an oxidation so as to oxidize the at least one electrically insulated connection link.

14. The method as recited in claim 1, wherein a surface normal of a trench wall of the trench is provided with at least two different angles with regard to a direction that is perpendicular to the principal plane of extension of the substrate.

* * * * *